US009384859B2

(12) United States Patent
Yun (10) Patent No.: US 9,384,859 B2
(45) Date of Patent: Jul. 5, 2016

(54) REPAIR CIRCUIT AND SEMICONDUCTOR MEMORY DEVICE INCLUDING THE SAME

(71) Applicant: SK hynix Inc., Gyeonggi-do (KR)

(72) Inventor: Tae-Sik Yun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/627,875

(22) Filed: Feb. 20, 2015

(65) Prior Publication Data

US 2016/0104546 A1 Apr. 14, 2016

(30) Foreign Application Priority Data

Oct. 14, 2014 (KR) .................. 10-2014-0138225

(51) Int. Cl.
*G11C 7/00* (2006.01)
*G11C 29/00* (2006.01)
*G11C 8/10* (2006.01)
*G11C 29/04* (2006.01)
*G11C 29/50* (2006.01)

(52) U.S. Cl.
CPC .............. *G11C 29/781* (2013.01); *G11C 8/10* (2013.01); *G11C 29/04* (2013.01); *G11C 29/50* (2013.01)

(58) Field of Classification Search
CPC ....... G11C 29/50; G11C 29/02; G11C 11/401

USPC .......... 365/189.07, 200, 201, 230.06
See application file for complete search history.

(56) References Cited

U.S. PATENT DOCUMENTS

| 4,849,938 | A | * | 7/1989 | Furutani | ............... | G11C 29/844 365/200 |
| 5,576,999 | A | * | 11/1996 | Kim | ..................... | G11C 29/785 365/200 |
| 6,167,540 | A | * | 12/2000 | Azuma | ................ | G11C 29/844 365/200 |
| 2005/0041491 | A1 | * | 2/2005 | Kyung | ............... | G11C 29/4401 365/200 |

FOREIGN PATENT DOCUMENTS

KR 1020000074706 12/2000

* cited by examiner

*Primary Examiner* — Connie Yoha
(74) *Attorney, Agent, or Firm* — IP & T Group LLP (57) ABSTRACT

A repair circuit includes a normal decoder suitable for decoding partial input addresses of input addresses in response to a first control signal, a comparison unit suitable for comparing the partial input addresses and partial repair addresses of repair addresses in response to a second control signal, and generating a column repair signal when the partial input addresses and the partial repair addresses correspond to each other, and a redundancy decoder suitable for decoding the repair addresses in response to the column repair signal.

16 Claims, 4 Drawing Sheets

REPAIR CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2014-0138225, filed on Oct. 14, 2014, which is incorporated herein by reference in its entirety.

BACKGROUND

1. Field

Exemplary embodiments of the present invention relate to a semiconductor design technology, and more particularly, to a semiconductor memory device including a repair circuit for repairing defective memory cells.

2. Description of the Related Art

Figure 1:
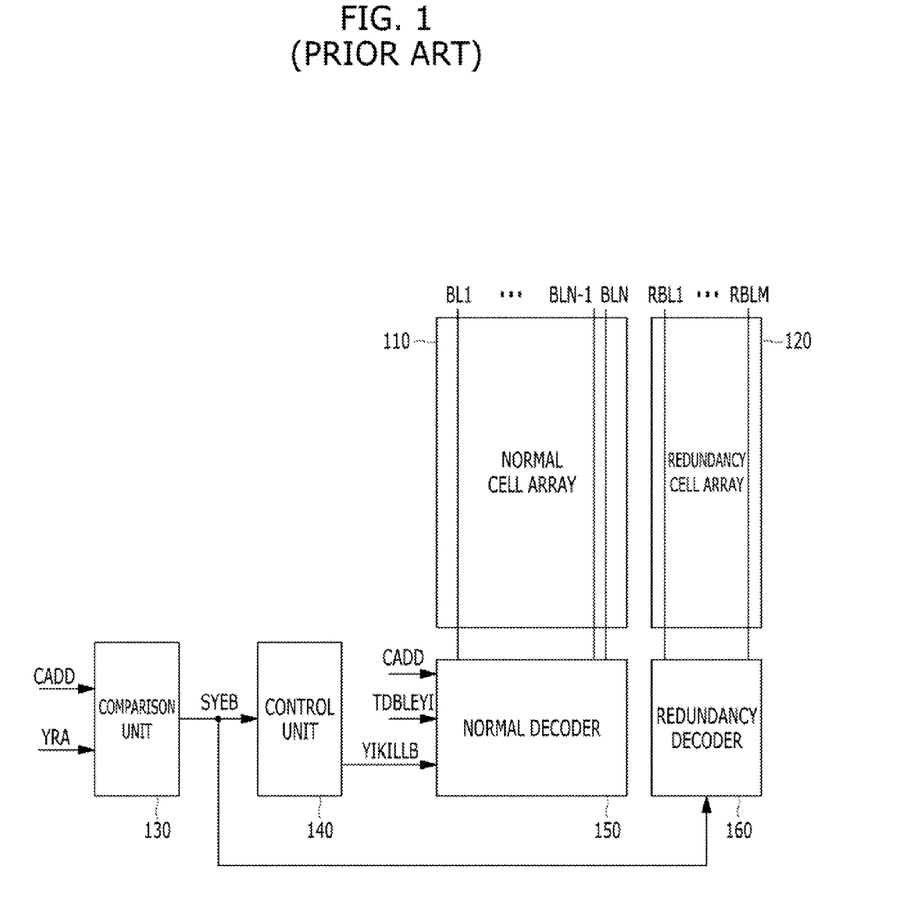
FIG. 1 is a diagram illustrating a conventional semiconductor memory device.

FIG. 1 is a diagram illustrating a conventional semiconductor memory device.

Referring to FIG. 1, a semiconductor memory device includes a normal cell array 110, a redundancy cell array 120, a comparison unit 130, a control unit 140, a normal decoder 150, and a redundancy decoder 160.

The normal cell array 110 includes a plurality of memory cells that are configured in a plurality of row lines (not shown) and a plurality of column lines, corresponding to a plurality of row addresses (not shown) and a plurality of column addresses CADD.

The redundancy cell array 120 includes a plurality of memory cells for replacing defective memory cells.

The normal cell array 110 includes normal column lines BL1 to BLN corresponding to a plurality of normal column signals, and the redundancy cell array 120 includes a plurality of redundancy column lines RBL1 to RBLM corresponding to a plurality of redundancy column signals.

The comparison unit 130 receives column addresses CADD and repair addresses YRA from an exterior (e.g. an exterior source of device). The repair addresses YRA may be received from a storage unit (not shown) that stores defect information. The comparison unit 130 may compare the column addresses CADD and the plurality of repair addresses YRA, and output comparison results as a plurality of column repair signals SYEB.

The control unit 140 receives the plurality of column repair signals SYEB. When even one of the plurality of column repair signals SYEB is activated, the control unit 140 activates a cut-off signal YIKILLB, meaning that the column addresses CADD applied from the exterior are defect addresses.

The normal decoder 150 receives the column addresses CADD, a test signal TDBLEYI, and the cut-off signal YIKILLB. The test signal TDBLEYI may be activated to perform a test operation by driving double column lines, not a single column line. When the cut-off signal YIKILLB is deactivated and the test signal TDBLEYI is activated, the normal decoder 150 ignores the most significant bit of the column addresses CADD, and decodes the received column addresses CADD to output decoded signals. The normal decoder 150 activates the normal column lines BL<1:N> corresponding to the decoded signals. The normal decoder 150 interrupts the decoding operation of the column addresses CADD when the cut-off signal YIKILLB is activated.

The redundancy decoder 160 receives and decodes the plurality of column repair signals SYEB, and activates the redundancy column lines RBL<1:M> of the redundancy cell array 120 in correspondence with the activated column repair signal SYEB.

Next, describing operations, the activated test signal TDBLEYI is inputted to the normal decoder 150 to perform the test operation by driving double column lines. By comparing the column addresses CADD and the repair addresses YRA, if it is determined as a comparison result that the column addresses CADD and the repair addresses YRA do not correspond to each other, the column repair signal SYEB is deactivated and, accordingly, the cut-off signal YIKILLB of the control unit 140 is deactivated. When the column addresses CADD and the test signal TDBLEYI are enabled, the normal decoder 150 ignores the most significant bit of the column addresses CADD, and decodes the received column addresses CADD to output decoded signals. The normal decoder 150 may activate the normal column lines BL<1:N> corresponding to the decoded signals. Since the normal decoder 150 ignores the most significant bit of the column addresses CADD in response to the test signal TDBLEYI, first and second normal column lines may be finally activated among the normal column lines BL<1:N>.

Conversely, if the column addresses CADD and the repair addresses YRA correspond to each other, the column repair signal SYEB is activated. The redundancy decoder 160 may receive and decode the column repair signals SYEB, and activate the redundancy column lines RBL<1:M> of the redundancy cell array 120 in correspondence with the activated column repair signal SYEB. The control unit 140 that receives the column repair signals SYEB generates the activated cut-off signal YIKILLB, and the normal decoder 150 interrupts the decoding operation in response to the cut-off signal YIKILLB. That is to say, even when the test signal TDBLEYI for a double column test mode is activated, the normal decoder 150 does not perform the decoding operation in response to the cut-off signal YIKILLB, and the normal column lines BL<1:N> are not activated.

Therefore, when the first normal column line corresponding to the column addresses CADD is not determined to be defective in the double column test mode, a test may be performed by simultaneously activating the first normal column line and the second normal column line, which have the same addresses, as the column addresses CADD, excluding its most significant bit. However, when the first normal column line is determined to be defective, a redundancy column line is activated through a repair operation, and the second normal column line is deactivated. In other words, in the double column test mode, if the first normal column line is determined to be defective and repaired between the first and second normal column lines, which have different addresses in terms of the most significant bit, a test may not be simultaneously performed for the remaining second normal column line.

SUMMARY

Various embodiments are directed to a semiconductor memory device capable of enabling a test operation using double column lines after a repair operation.

In an embodiment, a repair circuit may include a normal decoder suitable for decoding partial input addresses of input addresses in response to a first control signal, a comparison unit suitable for comparing the partial input addresses and partial repair addresses of repair addresses in response to a second control signal, and generating a column repair signal if the partial input addresses and the partial repair addresses correspond to each other, and a redundancy decoder suitable for decoding the repair addresses in response to the column repair signal.

When the first control signal is deactivated, the normal decoder may decode all of the input addresses. When the second control signal is deactivated, the comparison unit may compare all of the input addresses and all of the repair addresses, and generate the column repair signal if the input addresses and the repair addresses correspond to each other. The repair circuit may further comprise a duplication control unit suitable for deactivating the normal decoder in response to the column repair signal, and being deactivated in response to the second control signal.

The first control signal may be a double test mode signal, and the second control signal may be a signal for a write operation after the double test mode signal is activated.

The comparison unit may include first sub comparing sections suitable for respectively comparing the partial input addresses and the partial repair addresses excluding most significant bits of the input addresses and the repair addresses, and outputting comparison results, a second sub comparing section suitable for comparing the most significant bits of the input addresses and the repair addresses and outputting a comparison result, and suitable for setting the comparison result, in response to the second control signal such that the most significant bits of the input addresses and the repair addresses correspond to each other, and a merging section suitable for generating the column repair signal, based on the comparison results outputted from the first sub comparing sections and the second sub comparing section.

The duplication control unit may generate a cut-off signal for deactivating the normal decoder in response to the column repair signal.

The normal decoder may include a pre-decoder, suitable for decoding the input addresses if the cut-off signal is deactivated, and generating a column decoding signal, and a main decoder, suitable for selecting a normal column line corresponding to the column decoding signal.

The pre-decoder may retain a most significant bit of the input addresses in a don't care state, in response to the first control signal.

In an embodiment, a semiconductor memory device may include: a memory cell array including normal column lines and redundancy column lines, a normal decoder suitable for decoding input addresses, and accessing the normal column lines by retaining a predetermined bit of the input addresses in a don't care state in response to a first control signal, a comparison unit suitable for comparing the input addresses and repair addresses, and generating a column repair signal for accessing a redundancy column line, among the redundancy column lines, and a duplication control unit suitable for generating a cut-off signal for cutting off access to the normal column lines when the column repair signal is activated, wherein, in response to a second control signal, the comparison unit excludes predetermined bits of the input addresses and the repair addresses from comparison targets, and the duplication control unit holds the cut-off signal to a predetermined level.

The first control signal may be a double test mode signal and the second control signal may be a signal for a write operation after the double test mode signal is activated.

The comparison unit may include first sub comparing sections suitable for respectively comparing partial input addresses and partial repair addresses excluding most significant bits of the input addresses and the repair addresses, and outputting comparison results, a second sub comparing section suitable for comparing the most significant bits of the input addresses and the repair addresses and outputting a comparison result, and suitable for setting the comparison result in response to the second control signal such that the most significant bits of the input addresses and the repair addresses correspond to each other, and a merging section suitable for generating the column repair signal based on the comparison results outputted from the first sub comparing sections and the second sub comparing section.

The normal decoder may include a pre-decoder, suitable for decoding the input addresses if the cut-off signal is deactivated and generating a column decoding signal, and a main decoder, suitable for selecting a normal column line corresponding to the column decoding signal, among the normal column lines.

The pre-decoder may decode partial input addresses, excluding the predetermined bit of the input addresses, in response to the first control signal.

The semiconductor memory device may further include a redundancy decoder suitable for selecting the redundancy column line corresponding to the column repair signal, among the redundancy column lines, in response to the column repair signal.

In an embodiment, a method for operating a semiconductor memory device including normal column lines and redundancy column lines may include comparing input addresses and repair addresses, wherein remaining bits of the input addresses and the repair addresses excluding predetermined bits thereof are compared in a write operation under a double test mode, accessing a redundancy column line if the input addresses and the repair addresses correspond to each other as a comparison result of the comparing, and accessing a first normal column line corresponding to the input addresses based on the comparison result, wherein the first normal column line and a second normal column line corresponding to the remaining bits of the input addresses but different from the first normal column line in predetermined bits thereof are accessed in the write operation under the double test mode, regardless of the comparison result.

The comparing of the remaining bits of the input addresses and the repair addresses excluding the predetermined bits may include setting the most significant bits of the input addresses and the repair addresses to correspond to each other.

The accessing of the first normal column line may comprise, in other operations that the write operation under double test mode, cutting off access to the first normal column line if the input addresses and the repair addresses correspond to each other, and accessing the first and second normal column lines if the input addresses and the repair addresses are different from each other.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

When an element is referred to as being connected or coupled to another element, it should be understood that the former can be directly connected or coupled to the latter, or electrically connected or coupled to the latter via an intervening element there between. Furthermore, when it is described that one "comprises" (or "includes") or "has" some elements, it should be understood that it may comprise (or include) or have only those elements, or it may comprise (or include) or have other elements as well as those elements if there is no specific limitation. The terms of singular form may include plural forms unless directly stated otherwise.

Figure 2:
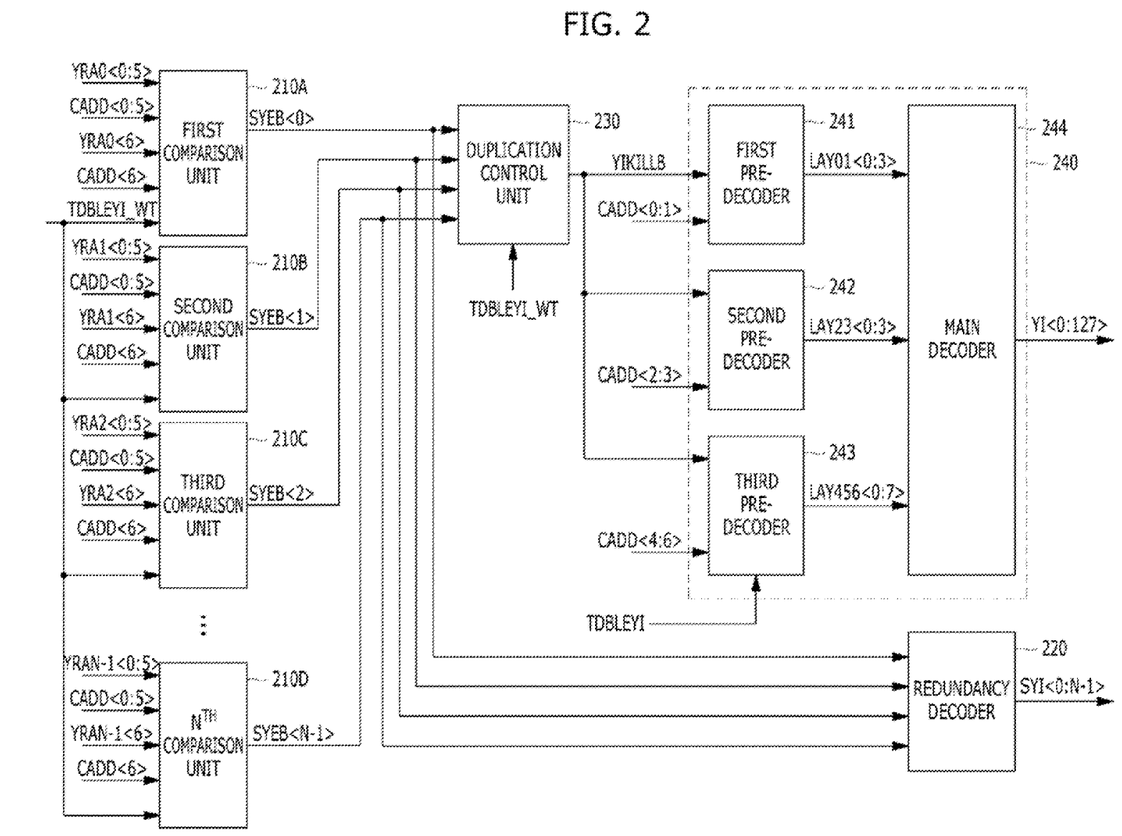
FIG. 2 is a block diagram illustrating an example of a semiconductor memory device in accordance with an embodiment.

FIG. 2 is a block diagram illustrating an example of a semiconductor memory device in accordance with an embodiment.

Referring to FIG. 2, a semiconductor memory device may include first to $N^{th}$ comparison units 210A, 210B, 210C, . . . and 210D, a redundancy decoder 220, a duplication control unit 230, and a normal decoder 240. Hereinbelow, a memory cell array including 128 normal column lines and N number of redundancy column lines and using 7-bit column addresses CADD<0:6> will be described as an example.

In the semiconductor memory device, a double test mode signal TDBLEYI may be activated by a double column line test mode for performing a test operation by driving 2 normal column lines among the normal column lines. The double test mode signal TDBLEYI may be set by receiving a signal, which is generated through a mode register set, and specific addresses for representing whether an entry is made to a test mode and selecting a double column line test mode among various test modes.

The first comparison unit 210A may receive column addresses CADD<0:6>, first repair addresses YRA0<0:6> and a double test write signal TDBLEYI_WT from an exterior (e.g. an exterior source or device). The first repair addresses YRA0<0:6> may be received from a storage (not shown), which is included in the semiconductor memory device, and stores detect information for a repair operation. The double test write signal TDBLEYI_WT may be activated in a write mode and deactivated in a read mode after the double test mode signal TDBLEYI is activated. The first comparison unit 210A may compare the column addresses CADD<0:6> and the first repair addresses YRA0<0:6>, and output a first column repair signal SYEB<0>.

When comparing the column addresses CADD<0:6> and the first repair addresses YRA0<0:6> in response to the double test write signal TDBLEYI_WT, the first comparison unit 210A may perform a comparing operation for remaining bits excluding the most significant bits. Namely, in response to the double test write signal TDBLEYI_WT, the first comparison unit 210A may set that the most significant bits of the column addresses CADD<0:6> and the first repair addresses YRA0<0:6> to correspond to each other, and output the first column repair signal SYEB<0> when all the remaining bits of the column addresses CADD<0:6> and the first repair addresses YRA0<0:6>, excluding the most significant bits, correspond to each other.

The second comparison unit 210B may receive the column addresses CADD<0:6>, second repair addresses YRA1<0:6> and the double test write signal TDBLEYI_WT from the exterior. The second comparison unit 210B may compare the column addresses CADD<0:6> and the second repair addresses YRA1<0:6>, and output a second column repair signal SYEB<1>. When comparing the column addresses CADD<0:6> and the second repair addresses YRA1<0:6> in response to the double test write signal TDBLEYI_WT, the second comparison unit 210B may perform the comparing operation for remaining bits excluding the most significant bits. Namely, in response to the double test write signal TDBLEYI_WT, the second comparison unit 210B may set the most significant bits of the column addresses CADD<0:6> and the second repair addresses YRA1<0:6> to correspond to each other, and output the second column repair signal SYEB<1> when all the remaining bits of the column addresses CADD<0:6> and the second repair addresses YRA1<0:6>, excluding the most significant bits, correspond to each other.

In the following, the component elements and operations of the third to $N^{th}$ comparison units 210C to 210D may be the same as the first comparison unit 210A and the second comparison unit 210B, except that third to $N^{th}$ repair addresses YRA2<0:6> to YRAN−1<0:6> inputted to the respective third to $N^{th}$ comparison units 210C to 210D are different.

The redundancy decoder 220 may decode first to $N^{th}$ column repair signals SYEB<0:N−1>, and output N number of redundancy column select signals SYI<0:N−1> corresponding to the first to $N^{th}$ column repair signals SYEB<0:N−1>.

Corresponding redundancy column lines may be activated in response to the redundancy column select signals SYI<0:N−1>, which are outputted from the redundancy decoder 220.

The duplication control unit 230 may receive the first to $N^{th}$ column repair signals SYEB<0:N−1> and the double test write signal TDBLEYI_WT. The duplication control unit 230 may hold a cut-off signal YIKILLB to a predetermined level regardless of whether the first to $N^{th}$ column repair signals SYEB<0:N−1> are activated, in response to the double test write signal TDBLEYI_WT. For example, if even one of the first to $N^{th}$ column repair signals SYEB<0:N−1> is activated, the duplication control unit 230 may activate the cut-off signal YIKILLB. However, if the double test write signal TDBLEYI_WT is activated, the duplication control unit 230 may deactivate the cut-off signal YIKILLB to the predetermined level regardless of whether the first to $N^{th}$ column repair signals SYEB<0:N−1> are activated.

The normal decoder 240 may include first to third pre-decoders 241, 242 and 243, and a main decoder 244.

The first pre-decoder 241 may be applied with and decode 2-bit column addresses CADD<0:1> among the 7-bit column addresses CADD<0:6> in response to the cut-off signal YIKILLB, and output first column decoding signals LAY01<0:3>.

The second pre-decoder 242 may be applied with and decode 2-bit column addresses CADD<2:3> among the 7-bit column addresses CADD<0:6> in response to the cut-off signal YIKILLB, and output second column decoding signals LAY23<0:3>.

The third pre-decoder 243 may be applied with and decode 3-bit column addresses CADD<4:6> among the 7-bit column addresses CADD<0:6> in response to the cut-off signal YIKILLB and the double test mode signal TDBLEYI, and output third column decoding signals LAY456<0:7>. As aforementioned, the double test mode signal TDBLEYI may be activated when performing a test mode using double column lines. The third pre-decoder 243 may retain the most significant bit of the 3-bit column addresses CADD<4:6> in a don't care state in response to the double test mode signal TDBLEYI.

The main decoder 244 may output normal column select signals YI<0:127> in response to the first to third column decoding signals LAY01<0:3>, LAY23<0:3>, and LAY456<0:7> outputted from the first to third pre-decoders 241, 242 and 243.

Corresponding normal column lines may be activated in response to the normal column select signals YI<0:127> outputted from the main decoder 244. The normal column lines activated by the main decoder 244 may be 2 normal column lines having address with the same remaining bits, excluding the most significant bits, since the third pre-decoder 243 doesn't care about the most significant bits.

Hereafter, operations of the semiconductor memory device will be described.

First, descriptions will be made for the case where the double test mode signal TDBLEYI is activated and the double test write signal TDBLEYI_WT is deactivated.

As the double test write signal TDBLEYI_WT is deactivated, the first to $N^{th}$ comparison units 210A, 210B, 210C and 210D may compare the column addresses CADD<0:6> and the first to $N^{th}$ repair addresses YRA0<0:6> to YRAN−1<0:6> received from the exterior, and output comparison results as the first to $N^{th}$ column repair signals SYEB<0> to SYEB<N−1>.

For example, when the column addresses CADD<0:6> are the same as the first repair addresses YRA0<0:6>, the first comparison unit 210A may output the first column repair signal SYEB<0> that is activated. In response to the first column repair signal SYEB<0>, the redundancy decoder 220 may decode the first column repair signal SYEB<0>, and output the first redundancy column select signal SYI<0>. The first redundancy column line corresponding to the first redundancy column select signal SYI<0> outputted may be activated. The duplication control unit 230 may output the activated cut-off signal YIKILLB in response to the first column repair signal SYEB<0> activated, among the first to $N^{th}$ column repair signals SYEB<0> to SYEB<N−1>. The first to third pre-decoders 241, 242 and 243 may be deactivated in response to the cut-off signal YIKILLB. As the first to third pre-decoders 241, 242 and 243 are deactivated, the main decoder 241 may receive invalid column decoding signals, and the normal column lines may not be driven.

Conversely, descriptions will be made for when the double test mode signal TDBLEYI is activated and, in particular, the double test write signal TDBLEYI_WT is activated and a write operation is to be performed.

As the double test write signal TDBLEYI_WT is activated, the first to $N^{th}$ comparison units 210A, 210B, 210C, ... and 210D may respectively compare the remaining bits of the 7-bit column addresses CADD<0:6> and the 7-bit first to $N^{th}$ repair addresses YRA0<0:6> to YRAN−1<0:6> received from the exterior, excluding the most significant bits. That is to say, in response to the double test write signal TDBLEYI_WT, the first to $N^{th}$ comparison units 210A, 210B, 210C, ... and 210D may set the most significant bits to correspond to each other as results of the comparison, and compare the remaining 6 bits and output comparison results as the first to $N^{th}$ column repair signals SYEB<00:N−1>.

For example, if the column addresses CADD<0:5>, corresponding to the remaining bits excluding the most significant bit CADD<6> of the column addresses CADD<0:6>, and the first repair addresses YRA0<0:5>, corresponding to the remaining bits excluding the most significant bit YRA0<6> of the first repair addresses YRA0<0:6> correspond to each other, the first column repair signal SYEB<0> may be activated in response to the double test write signal TDBLEYI_WT. Also, the second to $N^{th}$ comparison units 210B, 210C, ... and 210D may deactivate the second to $N^{th}$ column repair signals SYEB<1:N−1> as the column addresses CADD<0:5> and the second to $N^{th}$ repair addresses YRA1<0:5> to YRAN−1<0:5> do not correspond to each other as comparison results. The redundancy decoder 220 may decode the first column repair signal SYEB<0> and activate a redundancy column line corresponding to the decoded column repair signal SYEB<0>.

The duplication control unit 230 may receive the double test write signal TDBLEYI_WT and the first column repair signal SYEB<0> that is activated. The duplication control unit 230 may deactivate the cut-off signal YIKILLB, regardless of the first column repair signal SYEB<0>, in response to the double test write signal TDBLEYI_WT. The first to third pre-decoders 241, 242 and 243 may receive the cut-off signal YIKILLB and the column addresses CADD<0:6> from the exterior. The first pre-decoder 241 may receive and decode the cut-off signal YIKILLB and the column addresses CADD<0:1> of the first and second bits among the column addresses CADD<0:6>. The second pre-decoder 242 may receive and decode the cut-off signal YIKILLB and the column addresses CADD<2:3> of the third and fourth bits among the column addresses CADD<0:6>. The third pre-decoder 243 may receive and decode the cut-off signal YIKILLB and the column addresses CADD<4:6> of the fifth to seventh bits among the column addresses CADD<0:6>.

The third pre-decoder 243 may receive the double test mode signal TDBLEYI, and retain the seventh bit as the most significant bit among the column addresses CADD<4:6> of the fifth to seventh bits, in the don't care state. The main decoder 244 may receive the first to third column decoding signals LAY01<0:3>, LAY23<0:3> and LAY456<0:7> from the first to third pre-decoders 241, 242 and 243, and activate corresponding normal column lines. Accordingly, as the third pre-decoder 243 doesn't care about the most significant bit, the main decoder 244 may activate 2 normal column lines.

Hence, the semiconductor memory device in accordance with the embodiment may finally drive a redundancy column line corresponding to the first column repair signal SYEB<0> and first and second normal column lines having different addresses in terms of their most significant bits. In other words, when a first normal column line corresponding to a column address is defective in a double column test mode, the semiconductor memory device activates a redundancy column line, and at the same time, activates a second normal column line with addresses that are different in their most significant bit from those of the first normal column line, whereby it is possible to perform a double test operation even after a repair is performed.

Figure 3:
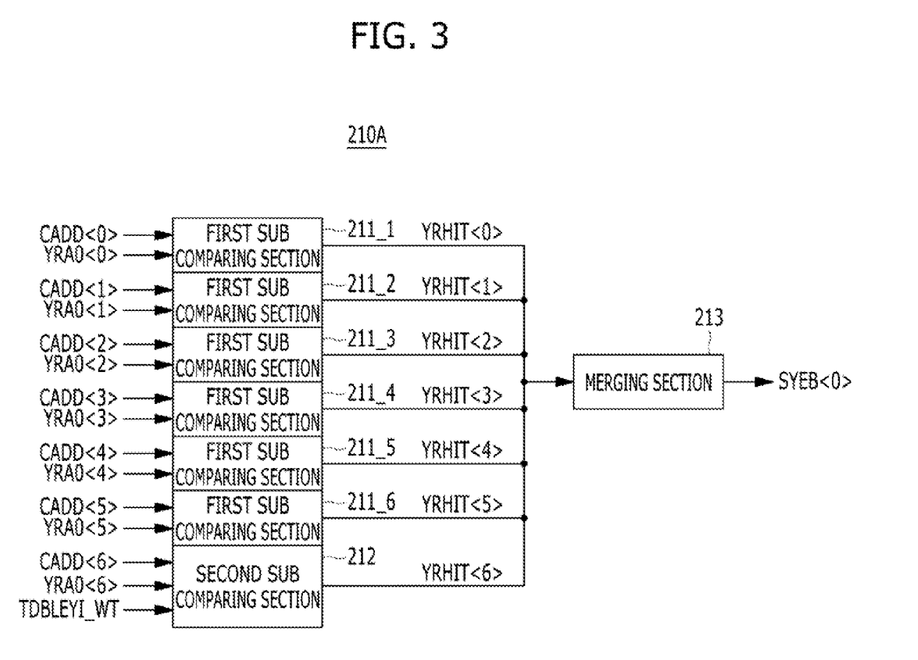
FIG. 3 is a block diagram illustrating an example of a first comparison unit shown in FIG. 2.

FIG. 3 is a detailed block diagram illustrating an example of the first comparison unit 210A shown in FIG. 2.

Referring to FIG. 3, the first comparison unit 210A may include 6 first sub comparing sections 211_1, 211_2, ... and 211_6, a second sub comparing section 212, and a merging section 213. The first sub comparing sections 211_1, 211_2, ... and 211_6 and the second sub comparing section 212 may respectively compare the column addresses CADD<0:6> and the first repair addresses YRA0<0:6> received from the exterior, and output comparison results YRHIT<0:6>. Namely, the 6 first sub comparing sections 211_1, 211_2, ... and 211_6 may perform comparisons for the first to sixth-bit column addresses CADD<0:5> and the first to sixth-bit first repair addresses RAD<0:5>, respectively, and output the corresponding comparison results YRHIT<0:5>. The second sub comparing section 212 may receive the double test write signal TDBLEYI_WT, the seventh bit column address CADD<6>, and the seventh bit first repair address YRA0<6>. In response to the double test write signal TDBLEYI_WT, the second sub comparing section 212 may compare the seventh bit column address CADD<6> and the seventh bit first repair address YRA0<6> and output the comparison result YRHIT<6>, or may set that the seventh bit column address CADD<6> and the seventh bit first repair address YRA0<6> to correspond to each other and output the comparison result YRHIT<6>. The merging section 213 may receive and merge the comparison results YRHIT<0:5> outputted from the 6 first sub comparing sections 211_1, 211_2, ... and 211_6 and the comparison result YRHIT<6> outputted from the second sub comparing section 212, and output the first column repair signal SYEB<0>.

Figure 4:
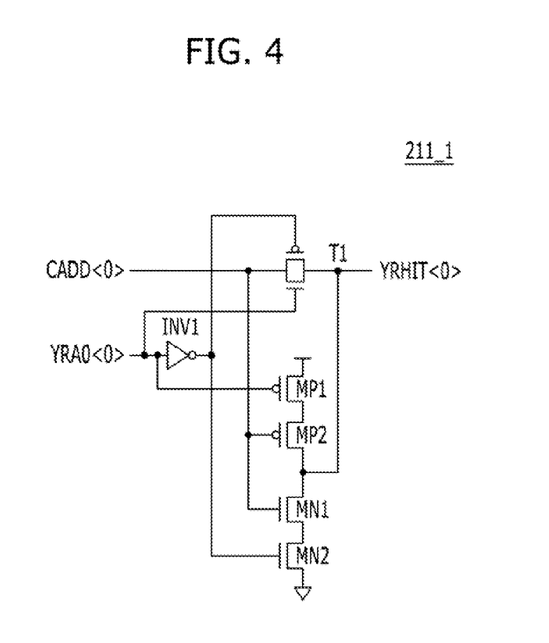
FIG. 4 is a circuit diagram illustrating an example of a first sub comparing section shown in FIG. 3.

FIG. 4 is a detailed circuit diagram illustrating an example of the first sub comparing section 211_1 shown in FIG. 3.

Referring to FIG. 4, the first sub comparing section 211_1 may include a transfer gate T1, and an inverter INV1. The transfer gate T1 transfers the first bit CADD<0> of the column addresses CADD<0:6> as it is, without changing the logic level thereof, as the comparison result YRHIT<0>, when the first bit YRA0<0> of the first repair addresses YRA0<0:6> is a high level. The inverter INV1 inverts the logic level of the first-bit column address CADD<0> and transfers the inverted first-bit column address CADD<0> as the comparison result YRHIT<0> when the first-bit first repair address YRA0<0> is a low level. The first sub comparing section 211_1 may further include first to fourth transistors MP1, MP2, MN1 and MN2, which are driven in response to the first-bit column address CADD<0>, the first-bit first repair address YRA0<0> and the signal outputted from the inverter INV1.

Describing operations, if the first-bit first repair address YRA0<0> is the high level, the transfer gate T1 may be activated and output the logic level of the first-bit column address CADD<0> as it is. Conversely, if the first-bit first repair address YRA0<0> is the low level, the transfer gate T1 is deactivated. The third and fourth transistors MN1 and MN2 may be driven and output the comparison result YRHIT<0> as a low level when the first-bit column address CADD<0> is a high level. The first and second transistors MP1 and MP2 may be driven and output the comparison result YRHIT<0> as a high level when the first-bit column address CADD<0> is a low level.

That is to say, the comparison result YRHIT<0> of the high level may be outputted when first-bit the column address CADD<0> and the first-bit first repair address YRA0<0> are the same, and the comparison result YRHIT<0> of the low level may be outputted when the first-bit column address CADD<0> and the first-bit first repair address YRA0<0> are not the same.

Figure 5:
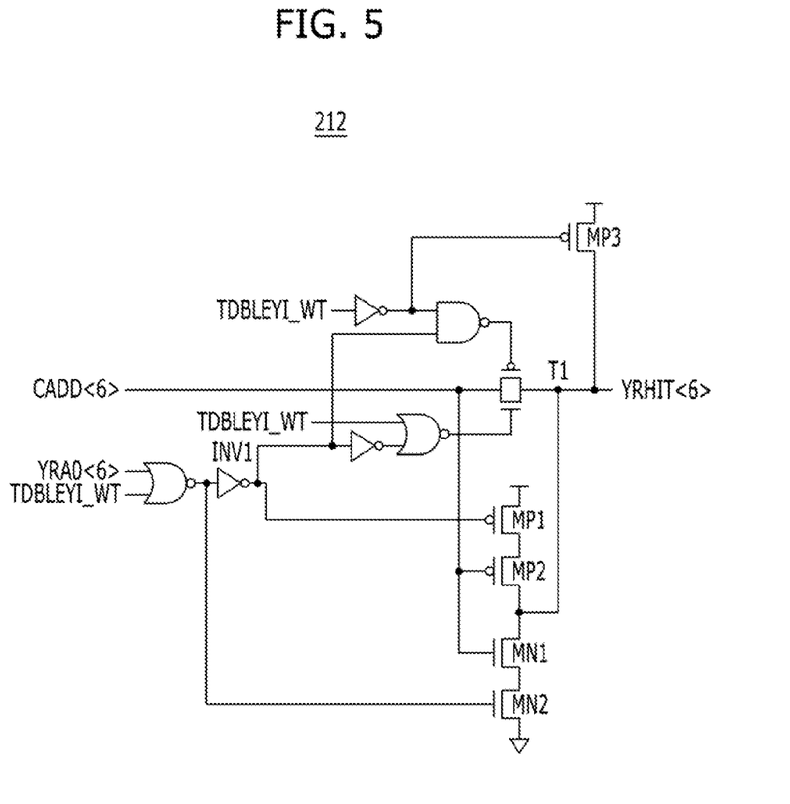
FIG. 5 is a circuit diagram illustrating an example of a second sub comparing section shown in FIG. 3.

FIG. 5 is a detailed circuit diagram illustrating an example of the second sub comparing section 212 shown in FIG. 3.

Referring to FIG. 5, the second sub comparing section 212 may include a transfer gate T1, and a first inverter INV1. The transfer gate T1 transfers the seventh bit CADD<6> of the column addresses CADD<0:6> as it is, without changing the logic level thereof, as the comparison result YRHIT<6>, when the seventh bit YRA0<6> of the first repair addresses YRA0<0:6> is a high level in when the double test write signal TDBLEYI_WT is deactivated to a low level. The first inverter INV1 inverts the logic level of the seventh-bit column address CADD<6> and transfers the inverted seventh-bit column address CADD<6> as the comparison result YRHIT<6> when the seventh-bit first repair address YRA0<6> is a low level. The second sub comparing section 212 may further include first to fourth transistors MP1, MP2, MN1 and MN2 that are driven in response to the seventh-bit column address CADD<6>, the signal outputted from the inverter INV1, and a merged signal of the double test write signal TDBLEYI_WT and the seventh-bit first repair address YRA0<6>. The second sub comparing section 212 may further include a pull-up transistor MP3 for outputting the comparison result YRHIT<6> of a high level when the double test write signal TDBLEYI_WT is activated to a high level.

Describing operations, when the double test write signal TDBLEYI_WT is the low level, the second sub comparing section 212 operates in the same manner as the operations of the first sub comparing section 211_1 of FIG. 4. That is, if the seventh-bit first repair address YRA0<6> is the high level, the transfer gate T1 may be activated, and output the logic level of the seventh-bit column address CADD<6> as it is. Conversely, if the seventh-bit first repair address YRA0<6> is the low level, the transfer gate T1 is deactivated. The third and fourth transistors MN1 and MN2 may be driven and output the comparison result YRHIT<6> as a low level when the seventh-bit column address CADD<6> is a high level. The first and second transistors MP1 and MP2 may be driven and output the comparison result YRHIT<6> as a high level when the seventh-bit column address CADD<6> is a low level.

Conversely, when the double test write signal TDBLEYI_WT is the high level, the pull-up transistor MP3 may be driven regardless of the seventh-bit column address CADD<6> and the seventh-bit repair address YRA0<6>, and output the comparison result YRHIT<6> of the high level.

Figure 6:
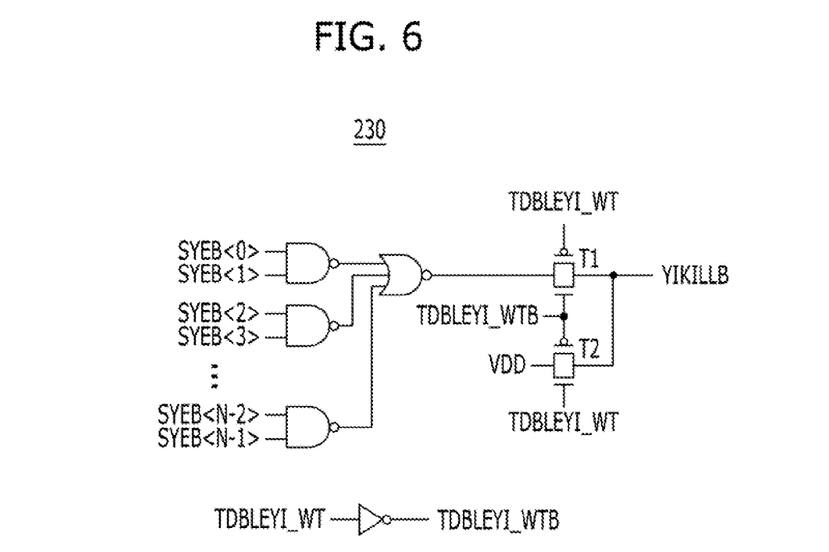
FIG. 6 is a circuit diagram illustrating an example of a duplication control unit shown in FIG. 2.

FIG. 6 is a detailed circuit diagram Illustrating an example of the duplication control unit 230 shown in FIG. 2.

Referring to FIG. 6, the duplication control unit 230 may receive the first to $N^{th}$ column repair signals SYEB<0:N−1> and the double test write signal TDBLEYI_WT. The duplication control unit 230 may include a first transfer gate T1 for outputting a low level signal as the cut-off signal YIKILLB when even one of the first to $N^{th}$ column repair signals SYEB<0:N−1> is activated when the double test write signal TDBLEYI_WT is the low level. The duplication control unit 230 may further include a second transfer gate T2 for outputting a high level signal being the level of a power supply voltage VDD, as the cut-off signal YIKILLB, regardless of the first to $N^{th}$ column repair signals SYEB<0:N−1>, when the double test write signal TDBLEYI_WT is the high level.

Accordingly, the duplication control unit 230 may cut off the decoding operation of the normal decoder 240 by outputting the cut-off signal YIKILLB having the low level to activate a redundancy column line when even one of the first to $N^{th}$ column repair signals SYEB<0:N−1> is activated when the double test write signal TDBLEYI_WT is the low level. Moreover, the duplication control unit 230 may allow the decoding operation to be performed through controlling the normal decoder 240 to be activated, by outputting the cut-off signal YIKILLB having the high level, regardless of the first to $N^{th}$ column repair signals SYEB<0:N−1>, when the double test write signal TDBLEYI_WT is the high level.

As is apparent from the above descriptions, in the semiconductor memory device in accordance with the embodiments, when the first normal column line, of first and second normal column lines having addresses with different most significant bits, is repaired in a double column line test mode, a test may be performed for the second normal column line as well.

Although various embodiments have been described for illustrative purposes, it will be apparent to those skilled in the art that various changes and modifications may be made without departing from the spirit and scope of the invention as defined in the following claims.

For instance, positions and kinds of the logic gates and transistors described as an example in the above embodiment should be differently realized according to the polarities of the signals inputted thereto.

What is claimed is:

1. A repair circuit comprising:
    a normal decoder suitable for decoding partial input addresses of input addresses in response to a first control signal;
    a comparison unit suitable for comparing the partial input addresses and partial repair addresses of repair addresses in response to a second control signal, and generating a column repair signal if the partial input addresses and the partial repair addresses correspond to each other; and
    a redundancy decoder suitable for decoding the repair addresses in response to the column repair signal,
    wherein the first control signal is a double test mode signal, and the second control signal is a signal for a write operation after the double test mode signal is activated.

2. The repair circuit according to claim 1, wherein when the first control signal is deactivated, the normal decoder decodes all of the input addresses,
    wherein when the second control signal is deactivated, the comparison unit compares all of the input addresses and all of the repair addresses, and generates the column repair signal if the input addresses and the repair addresses correspond to each other.

3. The repair circuit according to claim 2, further comprising:
    a duplication control unit suitable for deactivating the normal decoder in response to the column repair signal, and being deactivated in response to the second control signal.

4. The repair circuit according to claim 1, wherein the comparison unit comprises:
    first sub comparing sections suitable for respectively comparing the partial input addresses and the partial repair addresses, excluding most significant bits of the input addresses and the repair addresses, and outputting comparison results;
    a second sub comparing section suitable for comparing the most significant bits of the input addresses and the repair addresses and outputting a comparison result, and suitable for setting the comparison result in response to the second control signal such that the most significant bits of the input addresses and the repair addresses correspond to each other; and
    a merging section suitable for generating the column repair signal, based on the comparison results outputted from the first sub comparing sections and the second sub comparing section.

5. The repair circuit according to claim 3, wherein the duplication control unit generates a cut-off signal for deactivating the normal decoder in response to the column repair signal.

6. The repair circuit according to claim 5, wherein the normal decoder comprises:
    a pre-decoder suitable for decoding the input addresses if the cut-off signal is deactivated, and generating a column decoding signal; and
    a main decoder suitable for selecting a normal column line corresponding to the column decoding signal.

7. The repair circuit according to claim 6, wherein the pre-decoder retains a most significant bit of the input addresses in a don't care state, in response to the first control signal.

8. A semiconductor memory device comprising:
    a memory cell array including normal column lines and redundancy column lines;
    a normal decoder suitable for decoding input addresses, and accessing the normal column lines by retaining a predetermined bit of the input addresses in a don't care state in response to a first control signal;
    a comparison unit suitable for comparing the input addresses and repair addresses, and generating a column repair signal for accessing a redundancy column line, among the redundancy column lines; and
    a duplication control unit suitable for generating a cut-off signal for cutting off access to the normal column lines, when the column repair signal is activated,
    wherein, in response to a second control signal, the comparison unit excludes predetermined bits of the input addresses and the repair addresses from comparison targets, and the duplication control unit holds the cut-off signal to a predetermined level.

9. The semiconductor memory device according to claim 8, wherein the first control signal is a double test mode signal, and the second control signal is a signal for a write operation after the double test mode signal is activated.

10. The semiconductor memory device according to claim 8, wherein the comparison unit comprises:
    first sub comparing sections suitable for respectively comparing partial input addresses and partial repair addresses, excluding most significant bits of the input addresses and the repair addresses, and outputting comparison results;
    a second sub comparing section suitable for comparing the most significant bits of the input addresses and the repair addresses and outputting a comparison result, and suitable for setting the comparison result in response to the second control signal such that the most significant bits of the input addresses and the repair addresses correspond to each other; and
    a merging section suitable for generating the column repair signal based on the comparison results outputted from the first sub comparing sections and the second sub comparing section.

11. The semiconductor memory device according to claim 8, wherein the normal decoder comprises:
    a pre-decoder suitable for decoding the input addresses if the cut-off signal is deactivated, and generating a column decoding signal; and
    a main decoder suitable for selecting a normal column line corresponding to the column decoding signal, among the normal column lines.

12. The repair circuit according to claim 11, wherein the pre-decoder decodes partial input addresses, excluding the predetermined bit of the input addresses, in response to the first control signal.

13. The semiconductor memory device according to claim 8, further comprising:

a redundancy decoder suitable for selecting the redundancy column line corresponding to the column repair signal, among the redundancy column lines, in response to the column repair signal.

14. A method for operating a semiconductor memory device including normal column lines and redundancy column lines, comprising:

comparing input addresses and repair addresses, and wherein remaining bits of the input addresses and the repair addresses, excluding predetermined bits thereof, are compared in a write operation under a double test mode;

accessing a redundancy column line if the input addresses and the repair addresses correspond to each other as a comparison result of the comparing; and accessing a first normal column line corresponding to the input addresses based on the comparison result, wherein the first normal column line and a second normal column line, corresponding to the remaining bits of the input addresses but different from the first normal column line in predetermined bits thereof, are accessed in the write operation under the double test mode, regardless of the comparison result.

15. The method according to claim 14, wherein the comparing of the remaining bits of the input addresses and the repair addresses excluding the predetermined bits comprises:

setting most significant bits of the input addresses and the repair addresses to correspond to each other.

16. The method according to claim 14, wherein the accessing of the first normal column line comprises, in operations other than the write operation under the double test mode:

cutting off access to the first normal column line if the input addresses and the repair addresses correspond to each other; and accessing the first and second normal column lines if the input addresses and the repair addresses are different from each other.

* * * * *